US008100674B2

(12) United States Patent
Lin et al.

(10) Patent No.: US 8,100,674 B2
(45) Date of Patent: Jan. 24, 2012

(54) FAN AND FRAME THEREOF

(75) Inventors: Wei-Yi Lin, Taoyuan Hsien (TW);
Hui-Neng Yang, Taoyuan Hsien (TW);
Po-Hui Shen, Taoyuan Hsien (TW);
Cheng-Chieh Liu, Taoyuan Hsien (TW);
Kun-Ming Lee, Taoyuan Hsien (TW);
Cheng-Wei Yan, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 1173 days.

(21) Appl. No.: 11/898,076

(22) Filed: Sep. 7, 2007

(65) Prior Publication Data

US 2008/0053639 A1 Mar. 6, 2008

Related U.S. Application Data

(63) Continuation-in-part of application No. 11/366,477, filed on Mar. 3, 2006.

(30) Foreign Application Priority Data

Oct. 25, 2006 (TW) ................................ 95139296 A

(51) Int. Cl.
*F04B 35/04* (2006.01)
(52) U.S. Cl. ................ 417/423.15; 417/423.1; 361/697
(58) Field of Classification Search .............. 417/423.1, 417/423.5, 423.15; 361/695, 697
See application file for complete search history.

(56) References Cited

U.S. PATENT DOCUMENTS

| 5,313,365 | A | * | 5/1994 | Pennisi et al. | ................ 361/760 |
| 6,762,521 | B2 | * | 7/2004 | Peter et al. | ........................ 310/89 |
| 2002/0141866 | A1 | * | 10/2002 | Huang et al. | ................ 415/220 |

* cited by examiner

*Primary Examiner* — Charles Freay
*Assistant Examiner* — Patrick Hamo
(74) *Attorney, Agent, or Firm* — Birch, Stewart, Kolasch & Birch, LLP

(57) ABSTRACT

A fan has a fan frame for accommodating a first circuit board and a second circuit board. A fan frame includes a housing, a base, and at least one supporting element. The base is disposed in the housing, and the base includes a bottom portion and a tube portion, which is connected to and extended from the bottom portion. The supporting element is connected between the housing and the base. There is a predetermined distance between the bottom portion of the base and an end of the housing so as to form an accommodating space, the first circuit board is disposed on the base and is located on a first side of the bottom portion facing the tube portion, and the second circuit board is disposed in the accommodating space which is located on a second side of the bottom portion facing away from the tube portion.

20 Claims, 6 Drawing Sheets

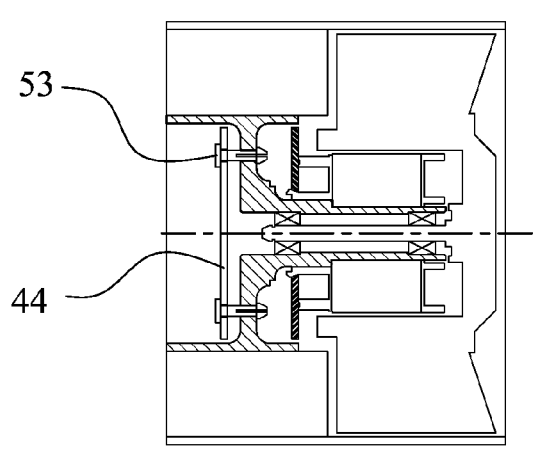
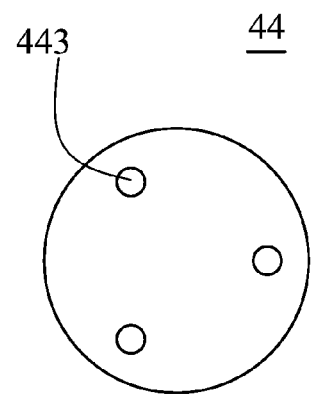
FIG. 6A            FIG. 6B
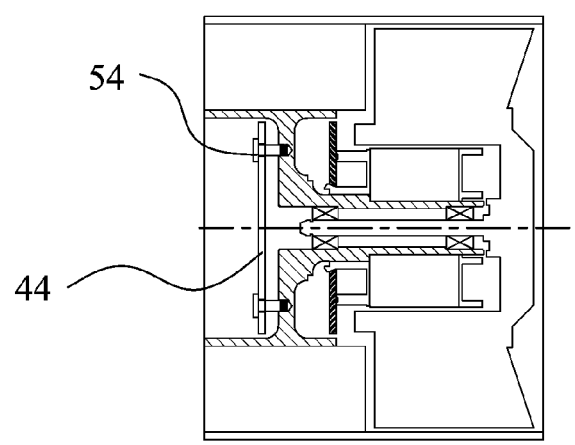
FIG. 7

FAN AND FRAME THEREOF

RELATED APPLICATIONS

The present application claims priority under U.S.C. §119(a) on Patent Application No(s). 095139296, filed in Taiwan, Republic of China on Oct. 25, 2006, the entire contents of which are hereby incorporated by reference. Also, this application is a continuation-in-part of pending U.S. patent application Ser. No. 11/366,477 filed Mar. 3, 2006, the disclosures of which are incorporated herein by reference in their entirety.

BACKGROUND OF THE INVENTION

1. Field of the Invention

The invention relates to a fan, and more particularly to a fan and frame having at least two circuit boards for accommodating more electronic elements.

2. Description of the Related Art

FIG. 1 is a schematic view of a conventional fan 1 including a frame 10 and a fan assembly 20. The fan frame 10 has a housing 11 and a base 12. The base 12 includes a bottom portion 121 and a tube portion 122 perpendicularly extending from the center of the bottom portion 121.

The fan module 20 includes a stator 21, a rotor 22 and a circuit board 23. The circuit board 23 is excavated forming a hole so as to allowing the circuit board 23 can pass through the tube portion 122 of the base 12 via the hole thereof and then the circuit board 23 is fixed to the base 12. The stator 21 is disposed on the base 12 and is electrically connected to the circuit board 23. The rotor 22 is coupled to the stator 21 and rotates with respect to the stator 21 via a magnetic force between the rotor 22 and the stator 21.

The fan design must account for automation and multiple functions. Thus, the amount of electronic elements installed on the circuit board 23 increases gradually. The structure of the conventional fan is, however, limited to a bearing structure. A hole is necessary to be disposed in the center of the circuit board 23 for allowing the circuit board 23 pass through and fix with the tube portion 122 of the base 12 thereon. Thus, the area available on the circuit board 23 for accommodating electronic elements is limited.

BRIEF SUMMARY OF INVENTION

A detailed description is given in the following embodiments with reference to the accompanying drawings. The invention provides a fan and a frame thereof including two circuit boards allowing for connection of more electronic elements than a conventional fan and frame thereof.

The invention further provides a method for fixing a circuit board on a base of the fan.

The invention provides a fan frame accommodating a first circuit board and a second circuit board. The fan frame includes a housing, a base and at least one supporting element. The housing is provided for accommodating a first circuit board and a second circuit board. The base disposed in the housing includes a bottom portion and a tube portion. The bottom portion is spaced apart from an end of the housing by a predetermined distance. The tube portion is connected to and extended from the bottom portion. The first circuit board is disposed on a first side of the base. The second circuit board is disposed in an accommodating space on a second side of the base. The supporting element is connected between the housing and the base. There is a predetermined distance between the bottom portion of the base and an end of the housing so as to form an accommodating space. The first circuit board is disposed on the base and is located on a first side of the bottom portion facing the tube portion, and the second circuit board is disposed in the accommodating space which is located on a second side of the bottom portion facing away from the tube portion.

The invention further provides a fan including a fan frame, a stator, a rotor, a first circuit board and a second circuit board. The fan frame includes a housing, a base and at least one supporting element. The base is disposed in the housing. The base includes a bottom portion and a tube portion. The tube portion is connected to and extended from the bottom portion of the base. A predetermined distance between the bottom portion of the base and an end of the housing so as to form an accommodating space. The first circuit board is disposed on the base and is located at a first side of the bottom portion facing the tube portion, and the second circuit board is disposed in the accommodating space which is located at a second side of the bottom portion facing away from the tube portion. The supporting element is connected between the housing and the base. The edge of the second circuit board includes an indentation or an opening allowing passage of a rotator, hook, screw, or rivet therethrough, fixing the second circuit board to the bottom portion. The circuit boards are electrically connected to the stator.

A predetermined distance exists between the bottom portion and an end of the housing. Compared with the conventional fan, the fan of the invention not only retains the area on a first side of the base corresponding to the tube portion of the bottom portion but also adds another area on a second side of the base corresponding to the tube portion of the bottom portion. Thus, the fan of the invention provides more space for accommodating electronic elements than the conventional fan. The second circuit board including an opening or an indentation is connected to and extended from the bottom portion via rotator, hook, screw or rivet for convenient assembly and product reliability. The circuit board is covered with a sealing glue to prevent deterioration due to steam, dust or smoke.

BRIEF DESCRIPTION OF DRAWINGS

The invention can be more fully understood by reading the subsequent detailed description and examples with references made to the accompanying drawings, wherein:

FIG. 6A is a schematic view showing that the second circuit board is fixed to the frame via rivets;

FIG. 6B is a schematic view showing that the second circuit board in FIG. 6A having a plurality of openings;

FIG. 7 is a schematic view showing that the second circuit board is fixed to the frame via screws;

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
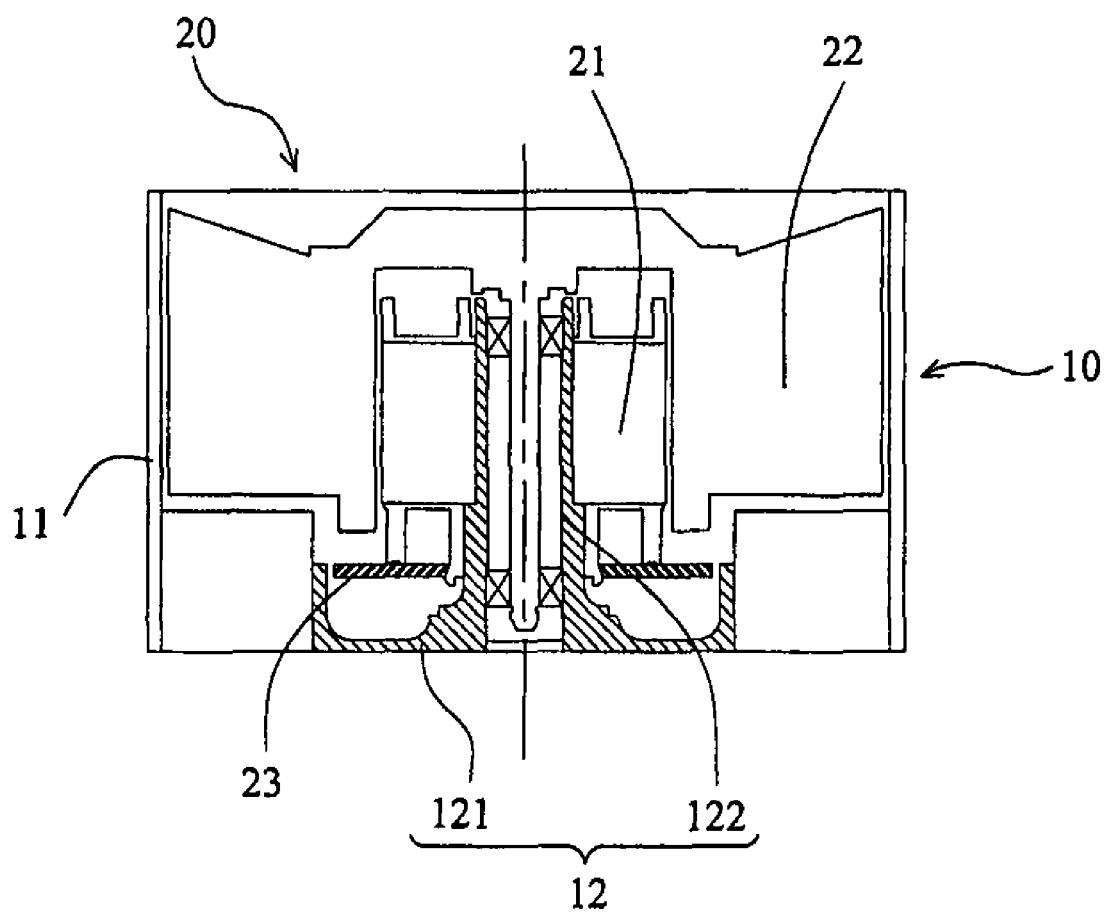
FIG. 1 is a schematic view of a conventional fan.
Figure 2:
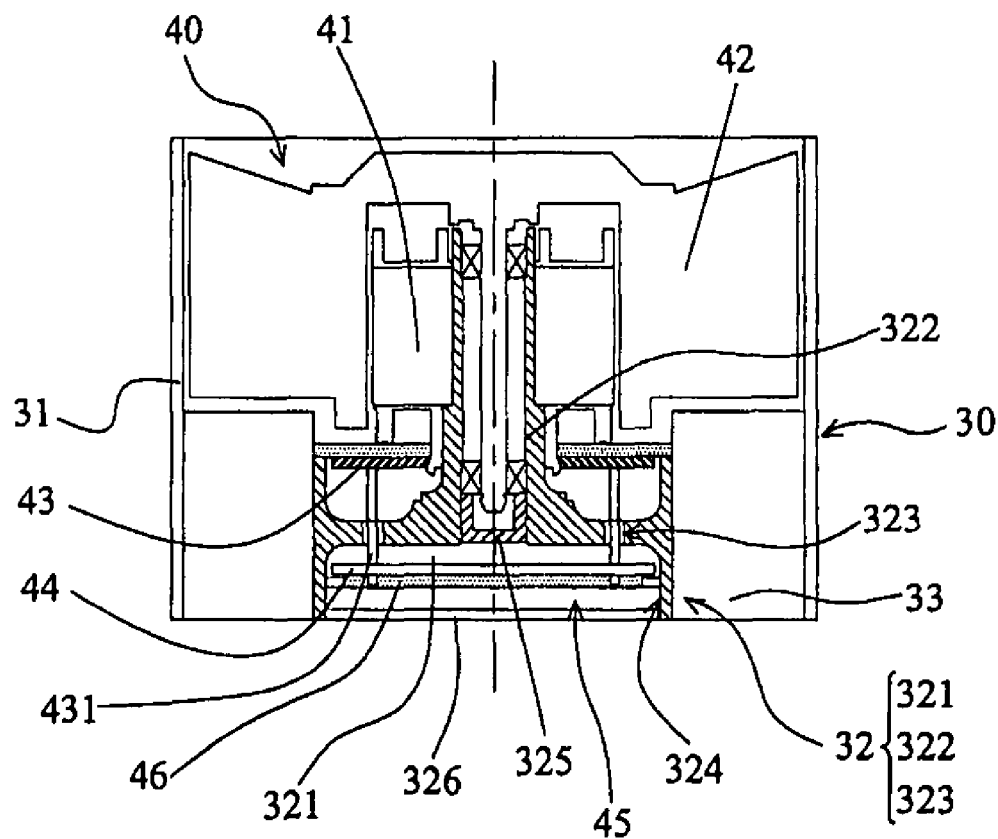
FIG. 2 is a schematic view of a fan according to the preferred embodiment of the present invention.

FIG. 2 shows an embodiment of a fan 3 of the invention. The fan 3 includes a frame 30 and a fan assembly 40. The frame 30 includes a housing 31, a base 32, and a plurality of supporting elements 33. The housing 31 is provided for accommodating a first circuit board 43 and a second circuit board 44. The cross-section of the housing 31 is substantially circular. The cross-section of the housing 31 may be rectangular, elliptical, or rhomboidal according to requirements.

The base 32 is installed in the housing 31, and the base 32 includes a bottom portion 321 and a tube portion 322. The tube portion 322 of the base 32 is connected to and extends perpendicularly from the center of the bottom portion 321. There is a predetermined distance between the bottom portion 321 of the base 32 and an end of the housing 31 so as to form an accommodating space 45. In other words, the bottom portion 321 of the base 32 contracts toward the interior of the housing 31. The first circuit board 43 is disposed on the base 32 and is located on a first side of the bottom portion 321 facing the tube portion 322, and the second circuit board 44 is disposed in the accommodating space 45 which is located on a second side of the bottom portion 321 facing away from the tube portion 322. In this embodiment, the bottom portion 321 of the base further includes two holes 323, and a sidewall 324 surrounding the bottom portion 321. The sidewall 324 and the bottom portion 321 form a substantially vertical angle. Note that the degree of the angle is not limited. The actual degree is based on the airflow of the fan 3. Moreover, the sidewall 324 may be a flat surface or a curved surface.

Further, the base 32 includes a blocking element 325 for sealing one end of the tube portion 322 near the bottom portion 321. The blocking element 325 may be a seal, a spacer or other elements. Referring to FIG. 2, the fan frame 30 further has a cover 326 for sealing the accommodating space 45. The cover 326 is installed on one end of the bottom portion 321 corresponding to the tube portion 322, and the edge of the cover 326 is engaged with the sidewall 324.

Figure 3:
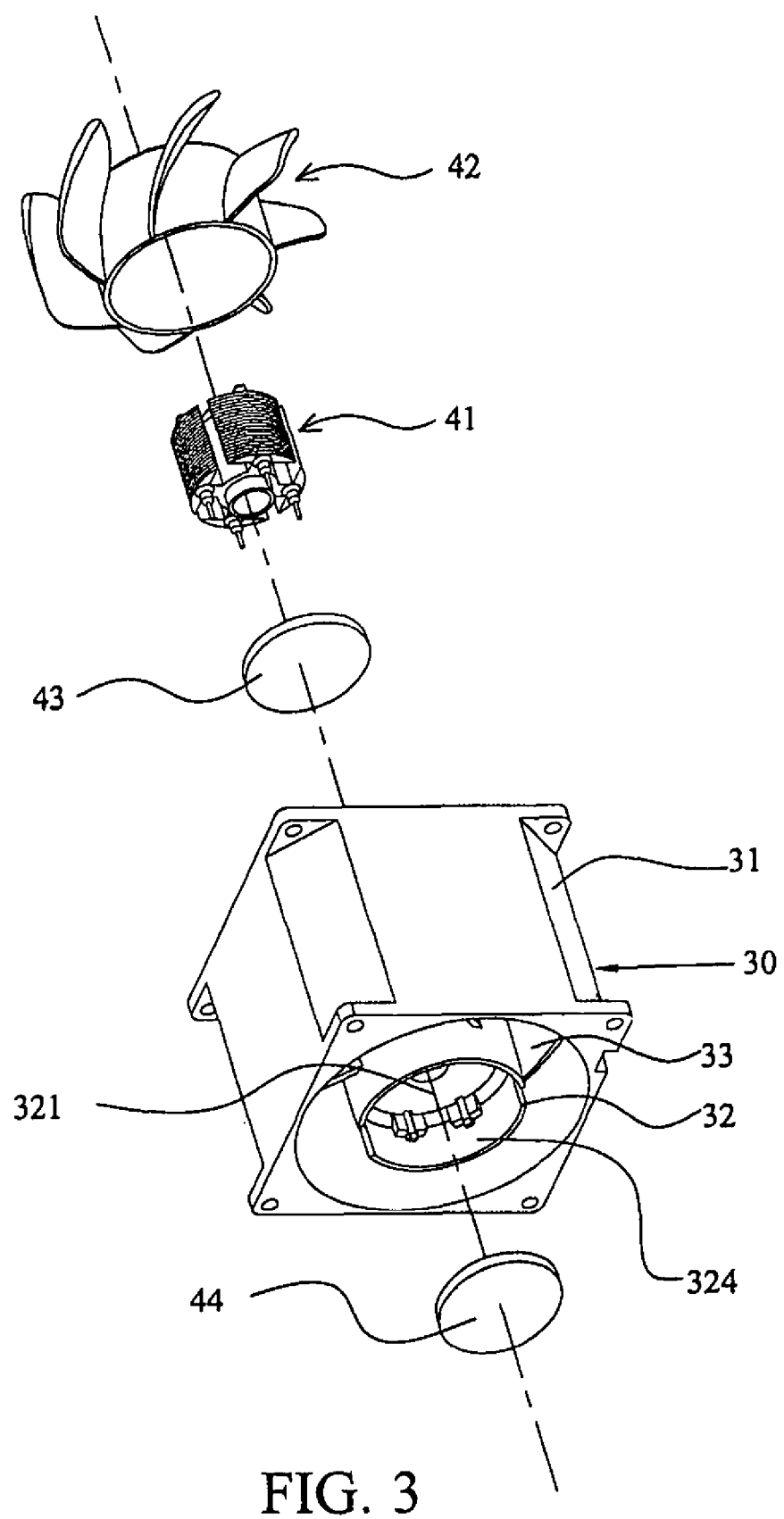
FIG. 3 is an exploded view of the fan according to the preferred embodiment of the present invention.

Referring to FIGS. 2 and 3, the supporting elements 33 are connected to the housing 31 and the base 32. In this embodiment, the supporting elements 33 are ribs, but the present invention is not limited thereto. The supporting elements 33 may be designed as stator blades so as to conduct the input or output airflow.

Referring to FIG. 2, the fan assembly 40 includes a stator 41, a rotor 42, a first circuit board 43 and a second circuit board 44. The stator 41 is installed on the bottom portion 321 of the base 32 near the tube portion 322. The stator includes a plurality of coils and two bearings. Each coil abuts against the edge of the tube portion 322. The bearings are installed on two ends of the tube portion 322.

The second circuit board 44 is disposed in the accommodating space 45 on a first side of the bottom portion 321. The second circuit board 44 includes two pins 431 for passing through the holes 323 to electrically connect the first circuit board 43 and the coil of the stator 41. Thus, the second circuit board 44 is fixed to the base 32 pins 431. The second circuit board 44 may additionally include two wires, terminals or cables (not shown) passing through the holes 323 for electrically connecting the stator 41. The second circuit board 44 may be installed on the base via the wires.

Figure 4A:
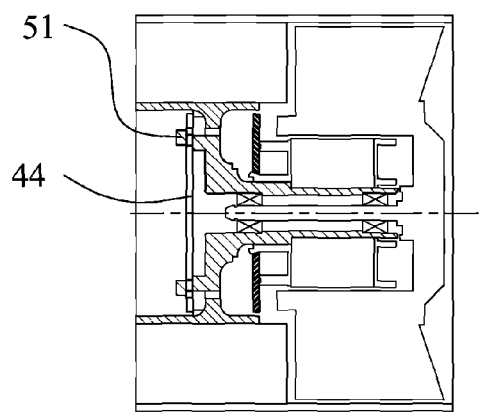
FIG. 4A is a schematic view of an embodiment showing that the second circuit board is rotatably fixed to the frame.
Figure 4B:
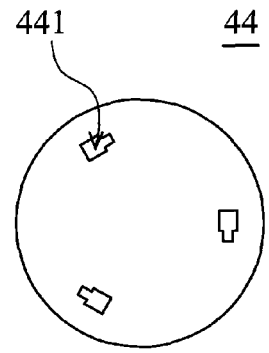
FIG. 4B is a schematic view showing that the second circuit board in FIG. 4A having a plurality holes.
Figure 5A:
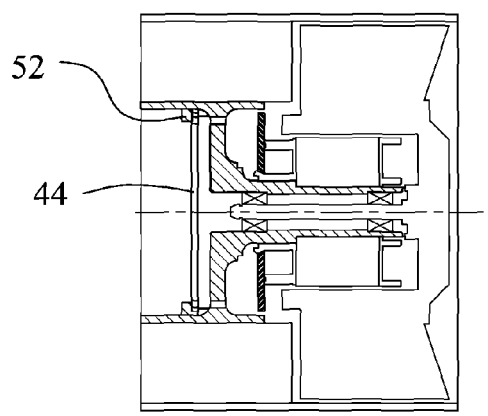
FIG. 5A is a schematic view of another embodiment showing that the second circuit board is rotatably fixed to the frame.
Figure 5B:
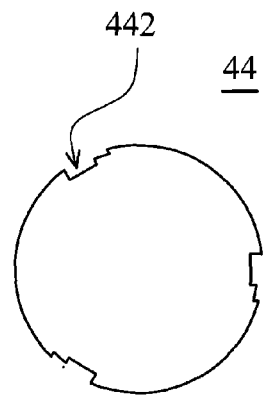
FIG. 5B is a schematic view showing that the second circuit board in FIG. 5A having a plurality of indentations.
Figure 8A:
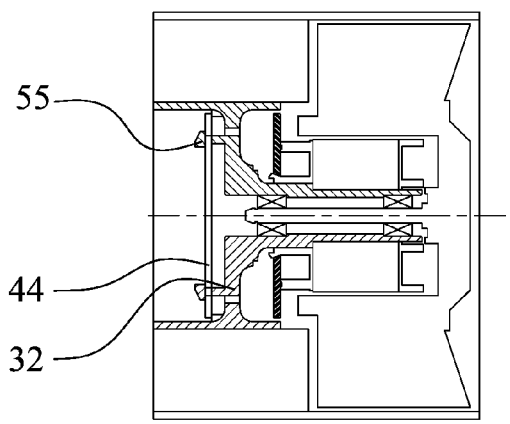
FIG. 8A is a schematic view showing that the second circuit board is fixed to the frame via hooks.
Figure 8B:
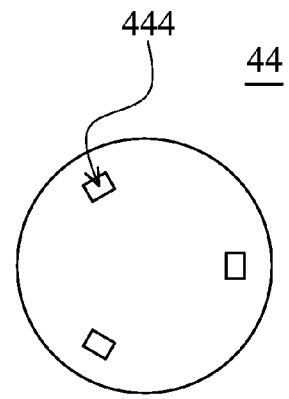
FIG. 8B a schematic view showing that the second circuit board in FIG. 8A having a plurality of openings.
Figure 9A:
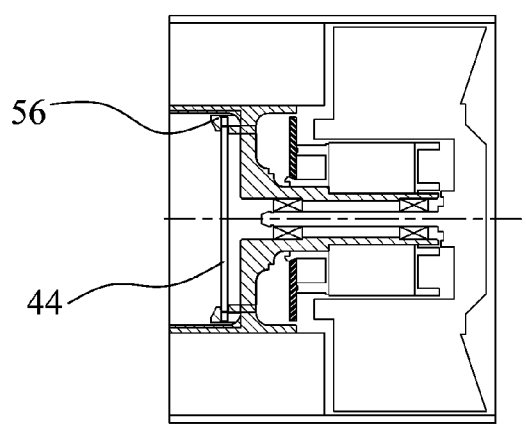
FIG. 9A is a schematic view showing that another embodiment of the second circuit board is fixed to the frame via hooks.
Figure 9B:
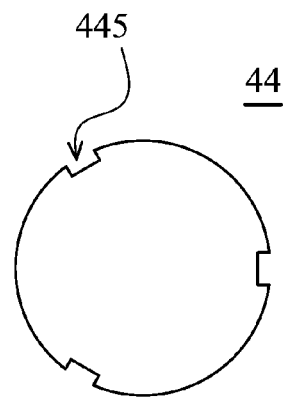
FIG. 9B is a schematic view showing that the second circuit board in FIG. 9A having a plurality of indentations.

The second circuit board 44 is fixed to the base 32 via pins 431 or wires. Further, the base 32 includes a plurality of engaging elements 51 or 52 protruding from the base 321 and corresponding to the second side of the tube portion 322 or sidewall 324 of the base 32. Thus, the second circuit board 44 is fixed to the base 32 via engaging elements 51 or 52 engaging openings 441 shown in FIGS. 4A, 4B, 5A and 5B. The bottom portion 321 (shown in FIG. 3) of the base 32 uses at least one fixture 51 (shown in FIG. 4A) passing through an opening 441 of the second circuit board 44 or locking the second circuit board 44. In other embodiment, the sidewall of the base 32 (shown in FIG. 3) has a bulge 52 passing through an indentation 442 of the second circuit board 44 for engaging the second circuit board 44, as shown in FIG. 5A. Additionally, a plurality of rivets 53 or screws 54 pass through holes of the second circuit board 44 fixing it to base 32 as shown in FIGS. 6A, 6B and 7. The base 32 may include a plurality of hooks 55 or 56. The hooks 55 or 56 protruding from the second side of the bottom portion corresponding to the tube portion 322. Thus, the hooks 55 or 56 connect to the openings 444 or the indentations 445 to fix the second circuit board 44 to the base 32 as shown in FIGS. 8A, 8B, 9A and 9B. The second circuit board 44 may be directly mounted on the base 32. The second circuit board 44 may be mounted on the base 32 other connecting means.

Please refer to FIG. 2, the fan 3 further includes a sealing glue 46 made of a resin or a silicon and applied to the circuit boards 43 or 44 for preventing deterioration due to steam, dust or smoke from erosion.

A predetermined distance exists between the base of the fan and an end of the housing. Compared with conventional fans, the accommodating space of the invention formed on the second side of the base provides more space for electronic elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fan frame, comprising:
   a housing for accommodating a first circuit board and a second circuit board;
   a base disposed in the housing and comprising a bottom portion, a sidewall surrounding the bottom portion and a tube portion which is connected to and extended from the bottom portion; and
   at least one supporting element, connected between the housing and the base;
   wherein the bottom portion and the sidewall of the base form an accommodating space, the first circuit board is disposed on the base and is located on a first side of the bottom portion facing the tube portion, and the second circuit board is disposed in the accommodating space which is located on a second side of the bottom portion facing away from the tube portion.

2. The fan frame as claimed in claim 1, wherein the bottom portion of the base comprises at least one hole, and the second circuit board comprises at least one wire, a pin, a terminal or a cable passing through the hole for external electrical connection.

3. The fan frame as claimed in claim 1, wherein the bottom portion of the base uses at least one fixture passing through or locking the second circuit board.

4. The fan frame as claimed in claim 3, wherein the second circuit board comprises at least one opening or indentation passed through or locked by the fixture, the fixture comprises an engaging element, a rivet, a screw or a hook.

5. The fan frame as claimed in claim 1, wherein the sidewall comprises a flat surface or a curved surface.

6. The fan frame as claimed in claim 5, wherein the sidewall of the base comprises a bulge for engaging the second circuit board.

7. The fan frame as claimed in claim 1, wherein the fan frame further comprises a cover for sealing the accommodating space.

8. The fan frame as claimed in claim 1, further comprising a sealing glue applied to the first circuit board or the second circuit board, wherein the sealing glue comprises a resin or a silicon.

9. The fan frame as claimed in claim 1, wherein the base further comprises a blocking element for sealing one end of the tube portion near the bottom portion.

10. A fan, comprising:
   a fan frame comprising a housing, a base, and at least one supporting element; wherein the base is disposed in the housing and comprises a bottom portion, a sidewall surrounding the bottom portion and a tube portion connected to and extended from the bottom portion, and the supporting element is connected between the housing and the base;
   a stator disposed on one end of the base near the tube portion;
   a rotor coupled to the stator; and
   a first circuit board and a second circuit board, both of which are electrically connected to the stator; and
   wherein the bottom portion and the sidewall of the base form an accommodating space, the first circuit board is disposed on the base and is located at a first side of the bottom portion facing the tube portion, and the second circuit board is disposed in the accommodating space which is located at a second side of the bottom portion facing away from the tube portion.

11. The fan as claimed in claim 10, wherein the bottom portion of the base comprises at least one hole, and the second circuit board comprises at least one wire, a pin, a terminal or a cable passing through the hole for electrically connecting with the first circuit board and the stator.

12. The fan as claimed in claim 10, wherein the bottom portion of the base uses at least one fixture passing through or locking the second circuit board.

13. The fan as claimed in claim 12, wherein the second circuit board comprises at least one opening or an indentation passed through or locked by the fixture, the fixture comprises an engaging element, a rivet, a screw or a hook.

14. The fan as claimed in claim 10, wherein the sidewall comprises a flat surface or a curved surface.

15. The fan as claimed in claim 14, wherein the sidewall comprises a bulge for engaging the second circuit board.

16. The fan as claimed in claim 10, wherein the fan frame further comprises a cover for sealing the accommodating space.

17. The fan as claimed in claim 10, further comprising a sealing glue applied to the first circuit board or the second circuit board, wherein the sealing glue comprises a resin or a silicon.

18. The fan as claimed in claim 10, wherein the base further comprises a blocking element for sealing one end of the tube portion near the bottom portion.

19. The fan as claimed in claim 10, wherein the supporting element comprises a rib or a static blade.

20. The fan as claimed in claim 10, wherein the housing of the fan frame has a substantially circular, rectangular, elliptical, or rhomboidal cross-section.

* * * * *